United States Patent [19]

Donjon

[11] 3,736,586

[45] May 29, 1973

[54] ANALOGUE-TO-DIGITAL VOLTAGE CONVERTER

[75] Inventor: Jacques Donjon, Paris 15, France

[73] Assignee: Societe de Fabrication d'Instruments de Mesure SFIM

[22] Filed: Mar. 22, 1972

[21] Appl. No.: 251,540

Related U.S. Application Data

[63] Continuation of Ser. No. 33,681, May 1, 1970, abandoned.

[52] U.S. Cl..340/347 NT, 340/347 AD, 340/347 SH

[51] Int. Cl.............................................H03k 13/02

[58] Field of Search.................340/347 AD, 347 NT, 340/347 SH; 235/154; 324/99, 100; 328/151

[56] References Cited

UNITED STATES PATENTS

| | | | |
|---|---|---|---|
| 3,631,468 | 12/1971 | Spaid | 340/347 SH |
| 3,480,948 | 11/1969 | Lord | 340/347 NT |
| 3,564,538 | 2/1971 | Bondzerl | 340/347 NT |

*Primary Examiner*—Maynard R. Wilbur
*Assistant Examiner*—Jeremiah Glassman
*Attorney*—Alan H. Levine

[57] ABSTRACT

The invention relates to an analogue-to-digital converter. The converter comprises a generator for supplying reference voltages decreasing in amplitude in accordance with a binary law, means for adding the reference voltages algebraically in succession to the input voltage in decreasing order, these voltages being added with a sign such that the successive sums tend towards zero, means for supplying a signal representing the sign of a particular algebraic sum, this signal being used to give the following reference voltage the sign suitable for the following algebraic sum to approach zero, and digital processing means for the signal representing the sign for supplying, in serial form, the numerical information representing the amplitude.

8 Claims, 6 Drawing Figures

INVENTOR:
JACQUES DONJON
By Breitenfeld & Levine
ATTORNEYS

Patented May 29, 1973

3,736,586

6 Sheets-Sheet 2

INVENTOR:
JACQUES DONJON

By Breitenfeld & Levine

ATTORNEYS

INVENTOR:
JACQUES DONJON
By Breitenfeld & Levine
ATTORNEYS

Patented May 29, 1973 3,736,586

6 Sheets-Sheet 4

INVENTOR:
JACQUES DONJON
By
Breitenfeld & Levine
ATTORNEYS

INVENTOR:
JACQUES DONJON
By Breitenfeld & Levine
ATTORNEYS

Patented May 29, 1973 3,736,586

6 Sheets-Sheet 6

INVENTOR:
JACQUES DONJON
By Braitenfeld & Levine
ATTORNEYS

ANALOGUE-TO-DIGITAL VOLTAGE CONVERTER

This application is a continuation of application Ser. No. 33,681, filed May 1, 1970 now abandoned.

The present invention relates to an analogue-to-digital voltage converter.

The converter according to the invention is designed to convert an analogue voltage into numerical information and comprises a generator for supplying reference voltages decreasing in amplitude in accordance with a binary law. The reference voltages are added algebraically in succession to the input voltage in decreasing order, these voltages being added with a sign such that the successive sums tend towards zero. A sign signal is developed representing the sign of each particular sum, this signal being used to give the following reference voltage the sign suitable for the following algebraic sum to approach zero. Digital processing means respond to the sign signals to supply, in serial form, the digital information representing the input voltage.

For a better understanding of how the present invention can be carried into effect, a preferred embodiment of the invention will be described hereinafter by way of non-limitative example with reference to the accompanying drawings, in which.

Figure 1:
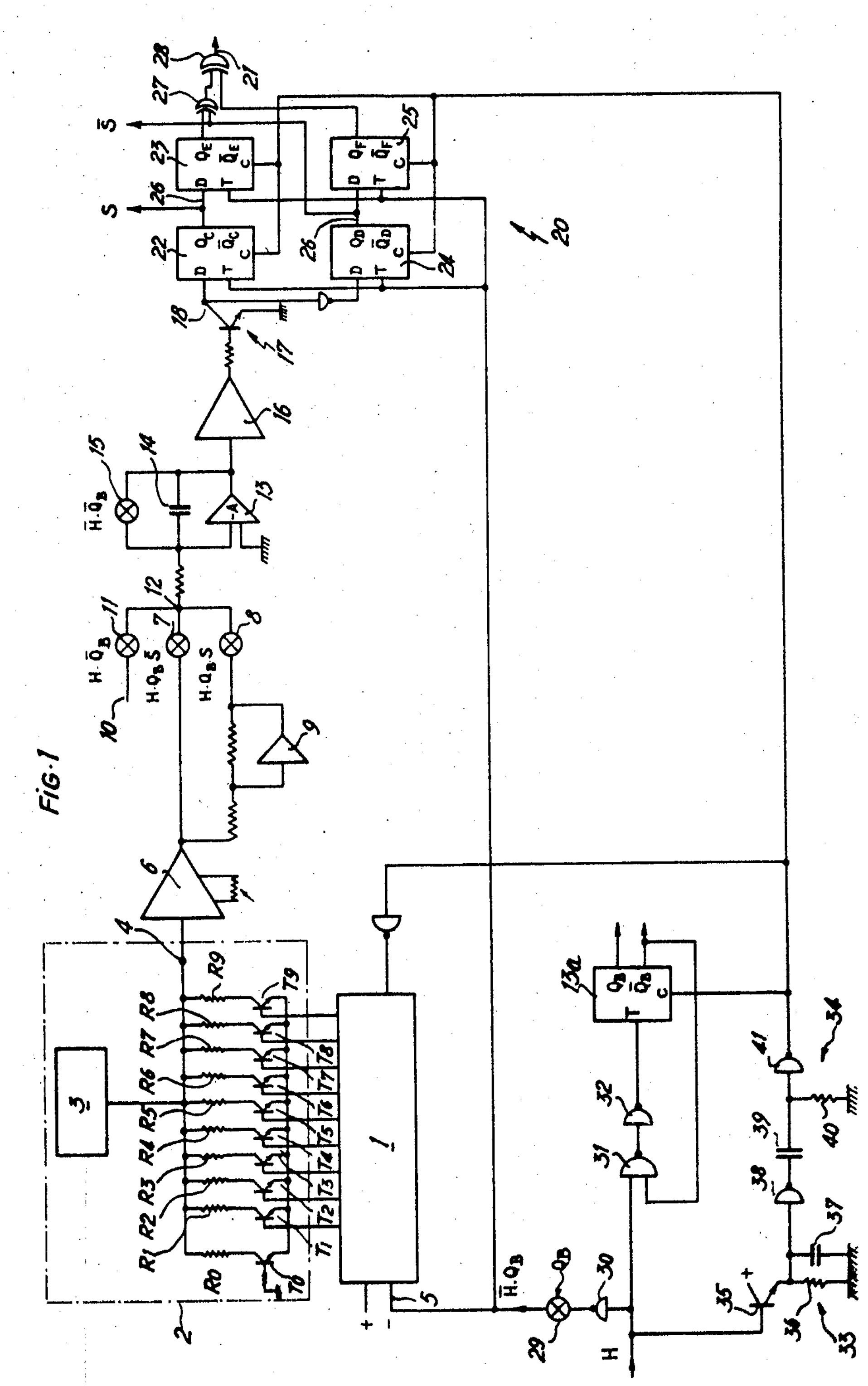
FIG. 1 is a circuit diagram of the converter according to the invention.

The converter of FIG. 1 includes a shift register 1 associated with a reference voltage generator 2. The generator 2 is composed of a current generator 3 feeding a network of nine resistors R0 to R9 connected in parallel. Each of these resistors is connected in series with the emitter-collector junction of a transistor T0 to T9. The transistor T0 is permanently unblocked, while the transistors T1 to T9 are normally blocked; each of the transistors T1 to T9 is associated with a stage of the shift register in such manner that it can be unblocked by it. The values of the resistors R1 to R9 are decreasing in a binary order, the resistors R1 and R0 being equal to each other. By way of example, the values are as follows:

R0 = 5,120 ohms
R1 = 5,120 ohms
R2 = 2,560 ohms
R3 = 1,280 ohms ohms
R4 = 640 ohms
R5 = 320 ohms
R6 = 160 ohms
R7 = 80 ohms
R8 = 40 ohms
R9 = 20 ohms It can therefore be seen that at the output 4 of the reference voltage generator there is permanently available a certain amplitude $Vr$ of known value equal to one half of the maximum value to be measured and determined solely by the drop in voltage across the terminals of the resistor R0, which drop in voltage is due to the flow of the constant current supplied by the current generator 3; it is necessary to observe that to this drop in voltage there must be added the drop in voltage between the emitter and the collector of the transistor T0, this drop in voltage being small (about 20 $m$V, for example) and substantially identical for all the transistors T1 to T9. When a second pulse is applied to the control input 5 of the shift register 1, the first transistor T1 is unblocked, so that the two resistors R1 and R0 are connected in parallel and the output voltage at 4 changes from $Vr$ to $Vr/2$. At the third pulse, the transistors T2 and T1 are unblocked and the output voltage changes to $Vr/4$, and so on. The result is that ten successive pulses cause the appearance at 4 of reference voltages varying in jumps in accordance with a binary function in $2^{-n}$; $Vr$; $Vr/2$; $Vr/4$ .. to $Vr/512$.

The reference voltages are applied to the input of a unity gain amplifier 6, the high input impedance of which does not cause any effect on the voltage across the terminals of the resistors. An adjustment by means of a balancing potentiometer 6*a* enables the voltage drop caused by the transistors T0 to T9 to be eliminated and the true value of the voltage existing across the terminals of the resistors to be obtained as output.

Figure 3:
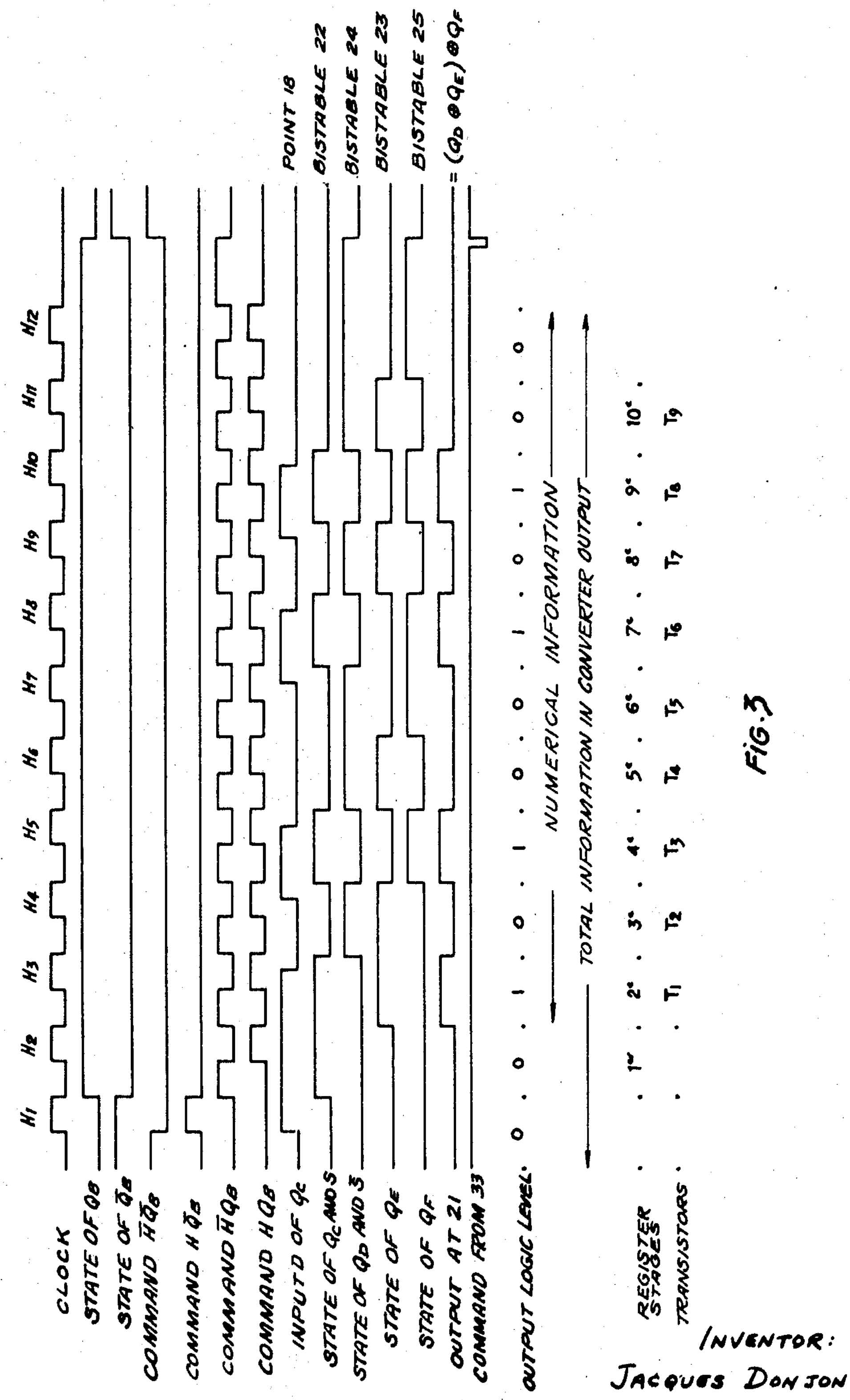
FIG. 3 is an operation diagram for the converter of FIG. 1.
Figure 4:
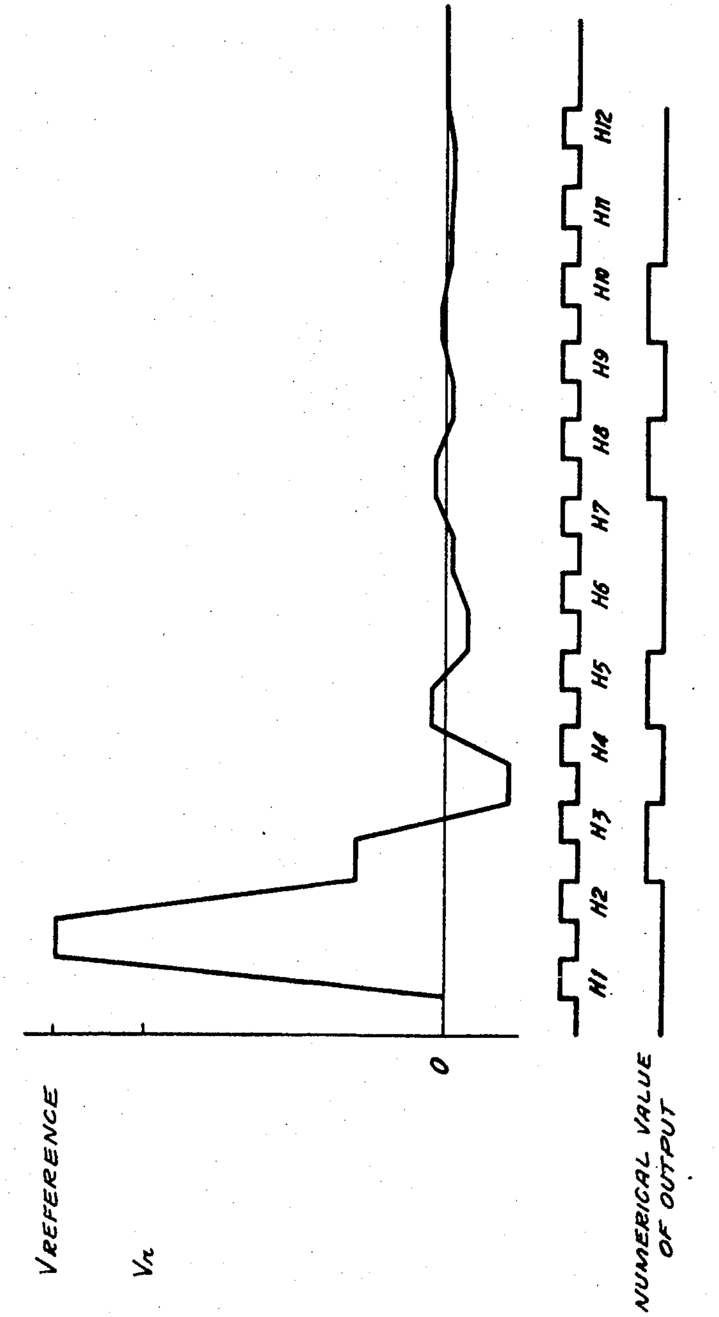
FIG. 4 shows an example of a series of the output levels S in the case where the voltage to be converted is zero.
Figure 5:
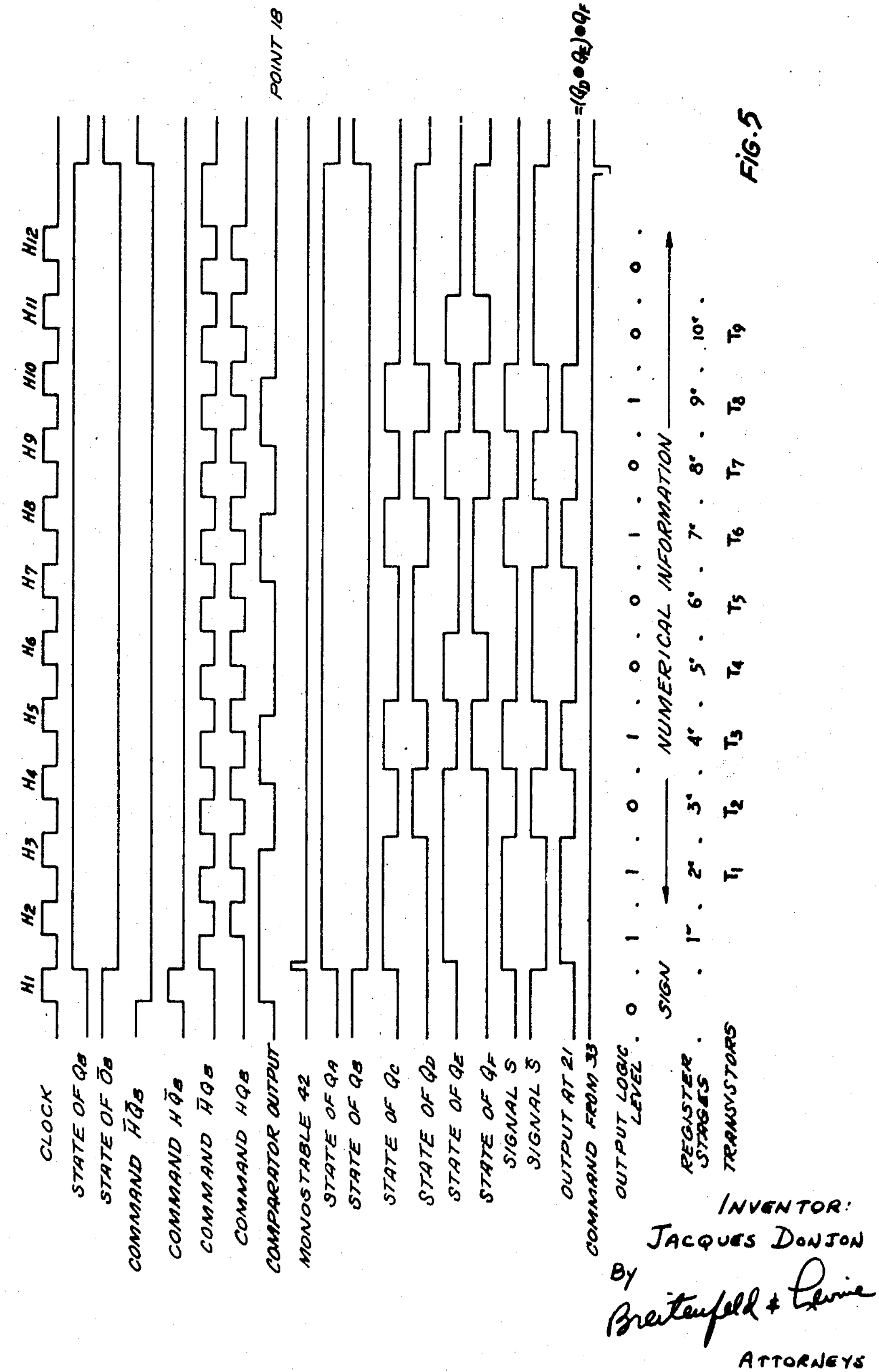
FIG. 5 is an operation diagram for the converter of FIG. 2.

The reference voltages at the output of the amplifier 6 are applied simultaneously to an input of a gate 7 and to an input of a gate 8 (after inversion of sign in the sign inverting device 9 in the case of the gate 8). The voltage to be converted is applied at 10 to the input of a gate 11. The outputs of the three gates 7, 8 and 11 are interconnected at 12. The logical functions achieved by these three gates are as follows:

gate 7 : $H \cdot Q_B \bar{S}$ gate 8 : $H \cdot Q_{B\ s}$ gate 11: $H \cdot \bar{Q}_B$ in which H represents the clock signal, $Q_B$ the output signal of a flip-flop 13*a*, the function of which will be explained hereinafter, and S the information on the sign with which the reference voltage is to be used. These various signals are shown in FIG. 3.

The signal appearing at 12 is applied to an integrator formed from an operational amplifier 13 and a capacitor 14. In parallel with the capacitor 14 there is connected a logical gate 15 performing the logical function $\bar{H}.\ \bar{Q}_B$, which is shown in FIG. 3, and the purpose of which is the resetting or clearing of the integrator during the time when the converter is not interrogated by the pulse H. The output signal of the integrator is applied to a comparator amplifier 16, which compares the output signal with the zero value so as to deliver a positive or negative signal according to the sign of the output signal of the integrator.

The signal representing the sign of the output signal is applied to a transistor 17 so as to block it or saturate it, according to the sign detected.

The zero and positive levels of the voltage on the collector 18 of the transistor 17 indicate respectively that the sign detected is negative and positive, it being possible, for example, for the zero level to be interpreted as a logical "0" and the positive level as a logical "1." When the sign detected is positive, the reference voltage is applied to the integrator through the gate 8, that is to say with an inverted sign. This is achieved by utilizing as signal S the output QC of a flip-flop 22 and as the inverse signal $\bar{S}$ the output QD of the flip-flop 24.

The logical signals supplied by the comparator are finally processed in a digital counting unit 20, which supplies at its output 21, in serial form, the numerical value of the amplitude of the voltage to be converted.

The unit 20 comprises four flip-flops 22, 23, 24 and 25; the flip-flops 22 and 23, on the one hand, and the flip-flops 24 and 25, on the other hand, are connected in series by the respective connections 26.

The logical signals issuing from the transistor 17 are applied directly to the D input of flip-flop 22 and to the D input of flip-flop 24 through an inverter 19. These flip-flops are D-type flip-flops which switch to the state specified by the D input when clocked or strobed on a T or trigger input. The logical signal on the D-input then appears at the Q output, the inverse signal appearing on the $\overline{Q}$ output. Each flip-flop also has a C input for clearing to the state Q=0.

Exclusive-OR gates 27 and 28 form the disjunctive sum of the two registers 22, 23 and 24, 25.

The signals applied at the inputs T of the flip-flops 22 to 25 are signals representing the logical function $\overline{H}\cdot Q_B$ obtained in the gate 29 as a result of the logical combination of the inverse $\overline{H}$ of the clock signals and the signals $Q_B$ from the flip-flop 13. The inverse of the clock signals is obtained by means of an inverter 30.

The signal $Q_B$ is obtained by means of a logical assembly formed of two NAND gates 31 and 32 and the flip-flop **13*a*. The signal $Q_B$ changes to the logical "1" level starting from the descending front of the first clock pulse and remains there until the application of a reset or clear signal at the input C of the flip-flop 13*a*.**

The clear signal is obtained by means of an integrator 33 associated with a monostable 34. The integrator is formed by a transistor 35 fed at its base by the clock signal H and comprising in its emitter circuit an RC combination composed of a resistor 36 and a capacitor 37. The monostable is constituted by a T-network composed of an inverting gate 38, a capacitor 39, a resistor 40 and an inverting gate 41. The time constant of the RC circuit of the integrator is such that the circuit preserves between the clock pulses a voltage sufficient for not releasing the monostable. As soon as there are no more clock pulses, the monostable 34 operates and supplies a negative pulse which constitutes the clear pulse for all the logic circuits of the converter.

Figure 6:
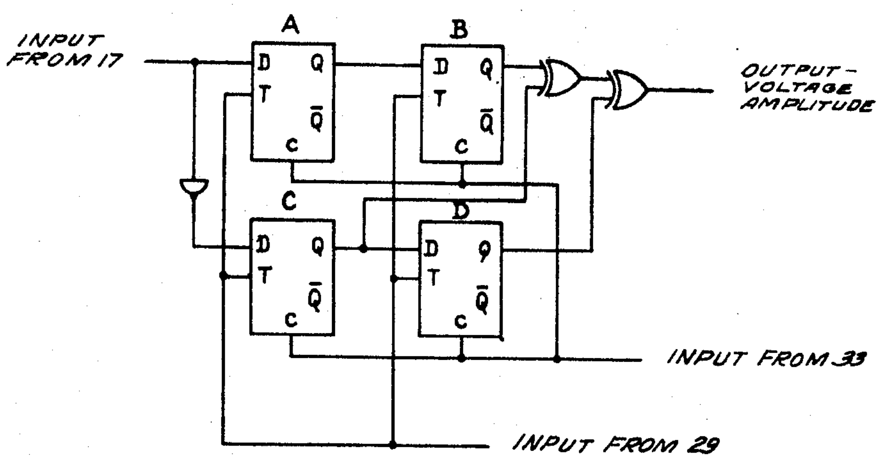
FIG. 6 shows an embodiment of a counting unit.

Before explaining the general operation of the converter, the operation of the counting unit will first be explained with reference to FIG. 6, in which the flip-flops 22, 23, 24 and 25 are labelled A, B, C and D respectively. At the start of any operation, all the D-flip-flops are cleared, that is to say all the outputs Q are at the logical "0" level and all the outputs $\overline{Q}$ are at the logical "1" level. Since the command for entering or setting the flip-flops is given by the pulse H, the output information is available during the following pulse H.

The comparator 16 which precedes this unit is adjusted so that for a zero voltage at its input it delivers a logical "0" level at point 18. The gates 27 and 28 form the function $(B \oplus C) \oplus D$ where $\oplus$ represents "exclusive OR."

By the very principle of the converter, the highest reference voltage is always entered. It is only after it is entered that it is retained or not by the counting unit. As all the binary values of the reference voltages are taken into account, it is the counting unit that discriminates the difference in the values by determining the validity of the output digit.

At the first setting pulse the states of the flip-flops are as follows:

| A | B | | |
|---|---|---|---|
| 1 | 0 | that is $(0 \oplus 0)$ | $\oplus$ 0=0 |
| C | D | | |
| 0 | 0 | | |

that is a logical "0" output level which does not form part of the numerical information.

At the second setting pulse, with a logical "1" level at the comparator, the states of the flip-flops are as follows:

| A | B | | |
|---|---|---|---|
| 1 | 1 | that is $(1 \oplus 0)$ | $\oplus$ 0=1 |
| C | D | | |
| 0 | 0 | | |

that is a logical "1" output level which represents the first most significant digit of the information.

If, at this second entering operation, the logical level of the comparator had been "0" the states of the flip-flops would have been as follows:

| A | B | | |
|---|---|---|---|
| 1 | 0 | that is $(1 \oplus 1)$ | $\oplus$ 0=0 |
| C | D | | |
| 0 | 1 | | |

that is a logical "0" output level which signifies that the reference voltage corresponding to the first digit was greater than the voltage to be measured and that, consequently, it is not valid. On the other hand, the second digit will be validated if it is followed by a third digit which is valid, which is shown by the following states of the flip-flops at the third setting pulse:

| A | B | | |
|---|---|---|---|
| 1 | 0 | that is $(0 \oplus 0)$ | $\oplus$ 1=1 |
| C | D | | |
| 0 | 1 | | |

that is a logical "1" output level for the second digit of the information.

On the other hand, if this third digit had not been valid because of a logical "0" level at the comparator, the following states of the flip-flops would have obtained at the third setting pulse:

| A | B | | |
|---|---|---|---|
| 0 | 0 | that is $(0 \oplus 1)$ | $\oplus$ 1=0 |
| C | D | | |
| 1 | 1 | | |

that is a logical "0" output level for the second digit of the information, and so on.

There has therefore been obtained a logical subtraction of two pieces of information in which are distributed all the binary digits utilized, starting with the highest digits. This represents an unusual logic operation.

The converter is controlled by a clock signal H which is formed of trains of pulses, the number of pulses in each train being equal to the number of digits into which it is desired to convert the voltage, that is to say this number is a function of the precision sought and to this number there are added two logical "0" level digits which precede the numerical information and which correspond to the operating delay of the converter. In the example shown in FIG. 3, the number of pulses in the information is ten, that is there is a total of twelve pulses numbered from H1 to H12.

The gate 11 is open, due to the signal $H\overline{Q}_B$, during the time of the pulse H1, so that the voltage to be converted, assumed here to be positive, is applied to the input of the amplifier 13 and the capacitor connected between the input and the output of this amplifier is charged negatively. The voltage increases linearly during this time and at the end of the pulse H1 the voltage at the output of the amplifier 13 is equal to $$-Eo = (E/RC)\, t$$

The time constant RC is defined as a function of the duration of each pulse such that the value of E*o* is between well-defined limits as a function of the possibilities of the amplifier.

This voltage applied to the input of the comparator amplifier 16 (operational trigger) brings its output voltage to its maximum negative value (about 10 volts). The transistor 17 is blocked and the voltage at its collector 18 is positive, for example at the value of + 5 volts compatible with the transistor-transistor logic used.

Immediately at the end of the pulse H1, the flip-flop 13*a* changes over and the logical level of $Q_B$ becomes "1" and that of $\overline{Q}_B$ becomes "0." This enables the signal $\overline{H}_2Q_B$ to be created by means of the inverter 30 and the gate 29 and this signal is applied to the input T of the flip-flops 22 to 25 and to the control input of the register 1, the serial input of which is held at the logical "1" level.

The first stage of the register is brought to the logical "1" level by the signal $\overline{H}_2Q_B$, but no command is achieved, the transistor T0 being permanently conducting and the other transistors T1 to T9 remaining blocked. On the other hand, the flip-flops 22 to 25 are put into the following states.

| A | B |
|---|---|
| 1 | 0 |
| C | D |
| 0 | 0 |

By means of the output $Q_C$ of the flip-flop 22 the signal S is created, which is at the logical "1" level, while the output $Q_D$ of the flip-flop 24 gives $\overline{S} = 0$.

Previously, the flip-flops 22 to 25 had been reset to zero at the end of a preceding measurement with all the outputs Q at the logical "0" level.

By means of the exclusive-OR gates 27 and 28 the disjunctive sums of the logical states of the outputs Q of the flip-flops 23, 24 and 25 are formed and there is obtained the output signal $$(0 \oplus 0) \oplus 0 = 0$$

At the following pulse $H_2$, the gate 8 is opened by the signal $H_2Q_B$ and the first reference voltage V*r* transmitted by the unity gain inverting amplifier 9, equal to $-$V*r*, is applied to the integrator 13 during the time of the pulse $H_2$.

This negative voltage at the input creates a current through the capacitor 14 which will reduce its negative charge by a certain value. If the voltage at the output of the integrator 13 remains negative, the logical level at 18 remains unchanged and at the end of the pulse $H_2$ the signal $\overline{H}_3Q_B$ will cause the flip-flops 22 to 25 to pass into the following states;

| A | B |
|---|---|
| 1 | 1 |
| C | D |
| 0 | 0 |

By means of the gates 27 and 28 there is obtained the output signal:

$$(1 \oplus 0) \oplus 0 = 1$$

This signal constitutes the highest digit of the numerical information. It is present as output of the converter throughout the duration of the pulse $H_3$.

By the action of the signal $\overline{H}_4Q_B$, the second stage of the register 1 has its output brought to the logical "1" level. The transistor T1 becomes conducting and the resistors R0 and R1 are connected in parallel, the reference voltage becoming (V*r*/2. The logical level of S being still "1" the gate 8 is still open and a voltage equal to $-$V*r*/2 is applied through the amplifier 9 to the integrator 13 during the time of the pulse $H_3$. This negative voltage at the input will produce a fresh reduction in the charge of the capacitor 14.

Two cases may occur:

1. The voltage at the output of the amplifier 13 is still negative. This means that the voltage to be measured is still larger than the sum of the voltages V*r* and V*r*/2.

In this case, the logical level at 18 is "1" and under the action of the signal $H_4Q_B$ the state of the flip-flops 22 to 25 becomes

| A | B |
|---|---|
| 1 | 1 |
| C | D |
| 0 | 0 |

and through the gates 27 and 28 there is obtained the output signal $$(1 \oplus 0) \oplus 0 =$$

This signal constitutes the second digit of the numerical information which is present throughout the duration of the pulse $H_4$. 2. The voltage at the output of the amplifier 13 has become positive. This means that the voltage to be measured is smaller than the sum of the voltages V*r* and V*r*/2. It is therefore necessary to eliminate this and look among the other reference voltages for the one which would be appropriate.

In this case, the logical level at 18 is "0" and under the action of the signal $H_4Q_B$ the state of the flip-flops 22 to 25 becomes

| A | B |
|---|---|
| 0 | 1 |
| C | D |
| 1 | 0 |

and through the gates 27 and 28 there is obtained the output signal $$(1 \oplus 1) \oplus 0 = 0$$

This signal constitutes the second digit of the numerical information which is present throughout the duration of the pulse $H_4$.

It can thus be seen that the counting unit 20 has automatically achieved the difference and re-established the true value of the information.

By the action of the signal $\overline{H}_4Q_B$, the third stage of the register 1 has its output brought to the logical "1" level.

The transistors T1 and T2 are conducting and the resistors R0, R1 and R2 are connected in parallel, the reference voltage becoming V*r*/4.

At the pulse $H_5$ the same process recurs and, according to the logical level at 18, the digit entered in the flip-flops 22 to 25 will be at the logical "1" or "0" level.

To demonstrate the manner of operation, the limit case may be taken, i.e., the voltage to be measured is zero. The following logical levels will be seen passing off in succession in the flip-flops 22 and 24: flip-flop 22
1 0 0 0 0 0 0 0 0 0
flip-flop 24 0 1 1 1 1 1 1 1 1 1
and by the action of the gates 27 and 28 the following will be obtained at the output 21:

| Time | $H_1$ | $H_2$ | $H_3$ | $H_4$ | $H_5$ | $H_6$ | $H_7$ | $H_8$ | $H_9$ | $H_{10}$ | $H_{11}$ | $H_{12}$ |
|---|---|---|---|---|---|---|---|---|---|---|---|---|
| | 0 | 0 | 0 | 0 | 0 | 0 | 0 | 0 | 0 | 0 | 0 | 0 |

information

The operation of the converter may be compared with that of a balance. To weigh a mass, a start is made by putting on the heaviest weight. Then the immediately lower weight is added to the first weight if the mass has a higher value or this weight is added to the mass if the mass has a lower value. The other immediately lower weights continue to be added to one of the two pans until equilibrium of the balance is obtained. The final weight is the result of the subtraction of the values of the weights placed on the two pans.

It is also possible to modify the converter so as to be able to convert a voltage of any algebraic value. In this case, the present invention (FIG. 2) provides means for introducing the sign of the voltage to be converted into the output signal before the conversion proper. The flip-flops 22 to 25 are still clocked or strobed by the signal $Q_B \cdot \overline{H}$ but this signal is not applied to them during the storing of the sign. This is achieved through a monostable 42 which is subjected to the signal $\overline{Q}_B$. The monostable delivers a signal which is applied, at the same time as the signals $Q_B$ and $\overline{H}$, to a NAND gate 43, the output signal of which is applied to the inputs T of the flip-flops 22 to 25 after inversion in 44.

The signal issuing from the monostable 42 is also applied after inversion to the input T of a flip-flop 45 and to an input of a NAND gate 46, the other input of which is connected to the collector 18 of the transistor 17. The output of the gate 46 is connected to the input P of the flip-flop 22 for forcing this flip-flop to the state Q=1.

The signal appearing at the collector 18 of the transistor 17 is moreover applied to one of the inputs of an exclusive-OR gate 47, the other input being connected to the output $\overline{Q}_A$ of the flip-flop 45. The output of this gate is connected to the input D of the flip-flop 22 and through the medium of an inverter 48 to the input D of the flip-flop 24.

The commands S and $\overline{S}$ must be inverted in accordance with the sign of the voltage to be measured. This is achieved by means of exclusive-OR gates. A gate 49 receives at its input the signal $Q_C$ from the flip-flop 22 and the signal $\overline{Q}_A$ from the flip-flop 45 and delivers the signal S as output.

The gate 50 receives at its input the signal $Q_D$ from the flip-flop 24 and the signal $\overline{Q}_A$ from the flip-flop 45 and delivers the signal $\overline{S}$ as output. The logical functions of the gates 7 and 8 therefore remain unchanged.

Operation is as follows:

At the pulse $H_1\overline{Q}_B$, the voltage to be measured is applied to the integrator 13 for the duration of the pulse. The capacitor 14 is charged and a voltage appears at the output of the amplifier 13. This voltage applied to the input of the comparator 16 controls as output the transistor 17. A logical voltage level appears at the collector 18 for the duration of the pulse $H_1$.

At the end of the pulse $H_1$, the flip-flop 13*a* changes over and the logical level of $Q_B$ becomes "1" while that of $\overline{Q}_B$ becomes "0. This has the effect of triggering the monostable 42 for a time less than one half of the pulse H. This monostable delivers a logical "0" level to the gate 43, which makes it inoperative, and a logical "1" level to the input T of the flip-flop 45, the input D of which is connected to the collector 18. After operation, this bistable will take at its output $Q_A$ the logical level identical to that of the collector 18 and, therefore, the logical "1" level with the positive sign and the logical "0" level with the negative sign.

The sign is applied to the input D of the flip-flop 22 through the exclusive-OR gate 47, the inputs of which are connected to the collector 18 and to the output $\overline{Q}_A$ of the flip-flop 45.

Moreover, the logical "1" level delivered by the monostable 42 is applied to one input of the gate 46, the other input being connected to 18. If the logical level of 18 is "1" the output signal of the gate which is at the logical "0" level is applied to the input P of the bistable 22, this having the effect of bringing the output $Q_C$ to the logical "1" level.

As soon as the monostable 42 has ceased to operate, the gate 43 is freed and a logical "1" signal appears at the output of the gate 44 during the signal $\overline{H}Q_B$. The states of the bistables 22 to 25 are modified and become:

| A | B |
|---|---|
| 1 | 1 |
| C | D |
| 0 | 0 |

Through the gates 27 and 28 there is obtained at the output 21

$$(1 \oplus 0) \oplus 0 = 1$$

This signal constitutes the positive sign bit during the time of the pulse $H_2$. It precedes the highest bit of the numerical information. In the case of a negative sign, the sign would be "0. By the action of the gate 47, the logical level at the input D of the bistable 22 is inverted with respect to that of the collector 18 and the counting operation of the unit 20 is effected in the same way as for the positive sign.

The commands S and $\overline{S}$ given by means of the gates 49 and 50 are also inverted to ensure correct operation of the converter.

Figure 2:
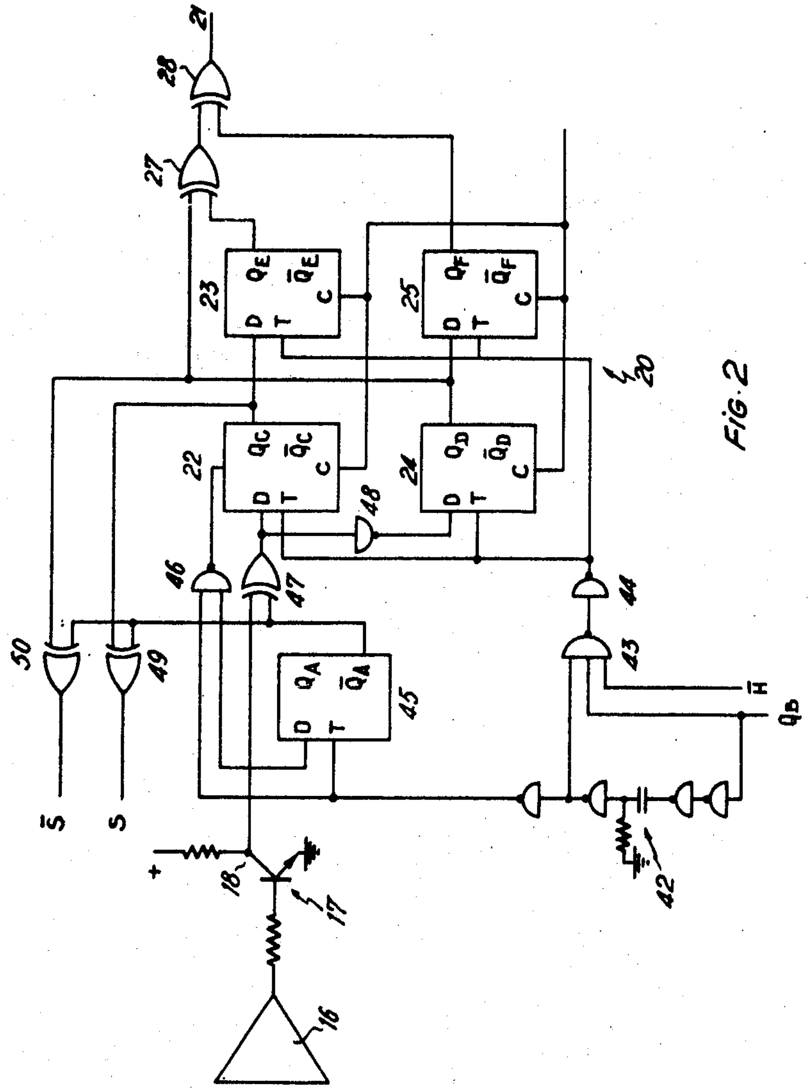
FIG. 2 is a partial circuit diagram of a converter in which the voltage to be converted may be positive or negative.

A data logging system can comprise a plurality of converters as in FIG. 1 or 2 and a central control unit. When data is required, the central unit sends the correct number of clock pulses H to all converters, which send back their serial binary outputs to the central unit.

I claim:

1. A data logging system comprising:

I. a plurality of analogue to digital converters, each of said converters converting an analogue input voltage into a digital output and comprising:

a. analogue storage means for initially storing a predetermined amount of said analogue input voltage;

b. comparator means responsive to a voltage stored in the storage means for generating a signal which indicates the polarity of the stored voltage;

c. generator means for sequentially generating a series of reference voltages, each voltage after the first in the series having a value equal to one half of the value of the preceeding voltage;

d. adding means responsive to the signal which indicates the polarity of the stored voltage, after each reference voltage is applied to the analogue storage means, for causing each of the reference voltages to have a positive or negative polarity dependent upon the polarity of the resultant of the analogue signal and all subsequent voltages applied to the analogue storage means prior to application of each reference voltage, which resultant may alternate between positive and negative values;

e. means for coupling predetermined amounts of the polarized reference voltages to the analogue storage means, thereby causing the stored voltage to approach zero; and f. digital processing means responsive to the successive polarity indications of the signal indicating the polarity of the voltage in the analogue storage means for supplying a serial digital output representative of the analogue input voltage; and II. a control means for supplying clock pulses to all said converters and for receiving said serial digital output from each, said control means supplying a predetermined number of clock pulses to said converters for generating said series of reference voltages.

2. An analogue to digital converter for converting an analogue input voltage into a digital output, comprising:

a. analogue storage means for initially storing a predetermined amount of said analogue input voltage;

b. comparator means responsive to a voltage stored in the storage means for generating a signal which indicates the polarity of the stored voltage;

c. generator means for sequentially generating a series of reference voltages, each voltage after the first in the series having a value equal to one half of the value of the preceeding voltage;

d. adding means responsive to the signal which indicates the polarity of the stored voltage, after each reference voltage is applied to the analogue storage means, for causing each of the reference voltages to have a positive or negative polarity dependent upon the polarity of the resultant of the analogue signal and all subsequent voltages applied to the analogue storage means prior to application of each reference voltage, which resultant may alternate between positive and negative values;

e. means for coupling predetermined amounts of the polarized reference voltages to the analogue storage means, thereby causing the stored voltage to approach zero; and f. digital processing means responsive to the successive polarity indications of the signal indicating the polarity of the voltage in the analogue storage means for supplying a serial digital output representative of the analogue input voltage.

3. An analogue to digital converter according to claim 2, comprising a source of clock pulses, and wherein said adding means comprise integrating means and control means therefore operative to apply said input voltage to said integrating means during a first clock pulse and operative to apply said reference voltages to said integrating means in succession during the successive clock pulses and with a sign in each case determined by said sign signal.

4. An analogue to digital converter according to claim 2, wherein said generator means comprises a succession of resistors connected in parallel with values decreasing in accordance with a binary law, switching elements in series with said resistors, a shift register with stages controlling said switching elements respectively, and means for applying clock pulses to said register to set said stages successively and accumulatively to switch said switching element on.

5. An analogue to digital converter according to claim 4, further comprising an operational amplifier whose input forms a summing junction for said resistors and which is adjusted to compensate for a voltage drop across said switching elements.

6. An analogue to digital converter according to claim 2, wherein said digital processing means comprising a flip-flop A responsive to said sign signal, a flip-flop B responsive to the output of said flip-flop A, a flip-flop C responsive to the inverse of said sign signal, a flip-flop D responsive to the output of said flip-flop C, and logical means for forming a disjunctive sum of the contents of said flip-flops.

7. An analogue to digital converter according to claim 6, wherein said logical means for providing the sum $(B \oplus C) \oplus D$.

8. An analogue to digital converter according to claim 6, wherein said logical means for forming a disjunctive sum of the contents of said flip-flops includes a first exclusive-OR gate coupled to said flip-flop A and to said flip-flop B, and a second exclusive-OR gate coupled to said first exclusive-OR gate and to said flip-flop D.

* * * * *